United States Patent
Bothe et al.

(10) Patent No.: US 8,379,411 B2
(45) Date of Patent: Feb. 19, 2013

(54) PIEZOELECTRIC CONVERTER WITH PRIMARY REGULATION AND ASSOCIATED PIEZOELECTRIC TRANSFORMER

(75) Inventors: Michael Bothe, Seligenstadt (DE); Stefan Mörbe, Osnabrück (DE)

(73) Assignee: Flextronics AP, LLC, Broomfield, CO (US)

( * ) Notice: Subject to any disclaimer, the term of this patent is extended or adjusted under 35 U.S.C. 154(b) by 0 days.

(21) Appl. No.: 12/664,277

(22) PCT Filed: Jun. 9, 2008

(86) PCT No.: PCT/EP2008/004588
§ 371 (c)(1), (2), (4) Date: Aug. 10, 2010

(87) PCT Pub. No.: WO2008/151766
PCT Pub. Date: Dec. 18, 2008

(65) Prior Publication Data
US 2010/0296316 A1    Nov. 25, 2010

(30) Foreign Application Priority Data
Jun. 11, 2007  (EP) ..................................... 07011397

(51) Int. Cl.
*H02M 3/335* (2006.01)
*H01L 41/00* (2006.01)
(52) U.S. Cl. ........................... 363/16; 310/318; 310/359
(58) Field of Classification Search ............. 363/15–19, 363/21.04, 21.08, 21.12, 21.16; 310/359, 310/318
See application file for complete search history.

(56) References Cited

U.S. PATENT DOCUMENTS

| | | | |
|---|---|---|---|
| 2,830,274 A | 4/1958 | Rosen et al. | |
| 3,657,579 A | 4/1972 | Kramer | |
| 3,689,781 A | 9/1972 | Kawada | |
| 6,016,052 A * | 1/2000 | Vaughn | 323/355 |
| 6,326,718 B1 | 12/2001 | Boyd | |
| 6,346,764 B1 | 2/2002 | Boyd | |

(Continued)

FOREIGN PATENT DOCUMENTS

| | | |
|---|---|---|
| DE | 3040916 | 5/1982 |
| DE | 10259088 | 7/2004 |

(Continued)

*Primary Examiner* — Adolf Berhane
*Assistant Examiner* — Jeffrey Gblende
(74) *Attorney, Agent, or Firm* — Marsh Fischmann & Breyfogle, LLP; Robert G. Crouch

(57) ABSTRACT

The present invention relates to voltage transformers, comprising multi-layer structures of piezoelectric ceramics, so-called piezoelectric transformers. The present invention further relates to switched mode power supplies, comprising such a piezoelectric transformer as part of a piezoelectric converter. The piezoelectric transformer according to the invention comprises a primary-side electrode arrangement (102) that can be connected to the primary-side voltage, a secondary-side electrode arrangement (104) on which the secondary-side voltage can be tapped, and an auxiliary electrode arrangement (106) for creating an auxiliary electrode voltage proportional to the secondary-side voltage, wherein the auxiliary electrode arrangement (106) is formed by at least two plane electrodes located opposite one another. A circuit arrangement for a switched mode power supply having at least one such piezoelectric transformer (100) comprises a control circuit (114), wherein the auxiliary electrode voltage is added to the control circuit (114) as a control variable for controlling the output voltage of the switched mode power supply.

12 Claims, 2 Drawing Sheets

U.S. PATENT DOCUMENTS

| | | | |
|---|---|---|---|
| 6,362,559 B1 | 3/2002 | Boyd | |
| 6,667,566 B2 * | 12/2003 | Kim et al. | 310/366 |
| 2002/0006810 A1 * | 1/2002 | Schiller | 455/552 |
| 2002/0024269 A1 * | 2/2002 | Nakatsuka et al. | 310/318 |
| 2002/0084722 A1 * | 7/2002 | Vaughn | 310/348 |
| 2005/0088858 A1 * | 4/2005 | Kogel et al. | 363/22 |
| 2006/0279970 A1 * | 12/2006 | Kernahan | 363/65 |
| 2006/0285366 A1 * | 12/2006 | Radecker et al. | 363/16 |

FOREIGN PATENT DOCUMENTS

| | | |
|---|---|---|
| DE | 102005047368 | 4/2007 |
| EP | 1146630 | 10/2001 |
| EP | 1211794 | 6/2002 |
| FR | 2503492 | 10/1982 |
| WO | WO 98/50966 | 11/1998 |

* cited by examiner

PIEZOELECTRIC CONVERTER WITH PRIMARY REGULATION AND ASSOCIATED PIEZOELECTRIC TRANSFORMER

BACKGROUND

The present invention relates to voltage transformers comprising multilayer structures of piezoelectric ceramics, so-called piezoelectric transformers. Furthermore, the present invention relates to switch mode power supplies that contain such a piezoelectric transformer as part of a piezoelectric converter.

Electromagnetic transformers based on wound coils were frequently used in the past to generate high voltage as well as to generate low voltage. Such electromagnetic transformers comprise an electrical conductor that is wound onto a core of a ferromagnetic material. Since a large number of windings is required for a large voltage transfer ratio, electromagnetic transformers with sufficient effectiveness can usually only be produced with difficulty in miniaturized form. Moreover, an electromagnetic transformer has many disadvantages in high-frequency applications, in particular on account of the magnetic material, such as, for example, rise of the hysteresis loss, vortex current losses or skin effect losses in the conductor. These losses limit the practically realizable frequency range of magnetic transformers to about 500 kHz.

In order to overcome these and other problems of the electromagnetic transformer, piezoelectric ceramic transformers, frequently designated as PT, were developed that make use of the piezoelectric effect. In contrast to electromagnetic transformers, piezoelectric transformers have a precisely limited frequency characteristic of the ratio of the output voltage to the input voltage, where the maximum is at the resonance frequency. This resonance frequency is a function of the material constants and the thickness of the material as well as of the entire transformer, and also of the piezoelectric material and the electrodes used.

Piezoelectric transformers have a number of advantages over the known electromagnetic transformers. In particular, given a comparable transformation ratio, the piezoelectric transformer can be constructed significantly smaller than an electromagnetic transformer. Furthermore, piezoelectric transformers can be constructed to be non-combustible and generate no electromagnetically-induced noise.

The ceramic bodies used for piezoelectric transformers can be realized different forms and shapes, e.g., as rings, flat plates and the like. Different construction forms of piezoelectric transformers are described, for example, in U.S. Pat. Nos. 6,362,559, 6,346,764 or 6,326,718. A known configuration of a piezoelectric transformer comprises a piezoelectric ceramic disk with a circular construction with segmented electrodes arranged on one or both sides of the disk.

U.S. Pat. No. 2,830,274 teaches a piezoelectric transformer of the so-called "Rose type" that exists in various embodiments. The typical Rose type PT comprises a flat ceramic plate that is considerably longer than it is wide and considerably wider than it is thick. The advantages of a piezoelectric transformer in comparison to a magnetic transformer are especially clear here. A piezoelectric transformer can, as already mentioned, be constructed more compactly than a magnetic transformer and has the further advantage of a simpler scalability to lower power.

in the known piezoelectric transformers, a multilayer electrode arrangement with differently segmented primary and secondary electrodes is used, as is schematically shown in FIG. 1.

Such a piezoelectric transformer offers, in particular in connection with switch mode power supplies, an interesting potential for minimizing the dimensions of such a switch mode power supply, as is of great importance especially in connection with portable devices.

For power supplies in the low-power range, i.e., for power below 100 W, in particular below 10 W, primarily switch mode power supplies are used today instead of out-of-date 50 Hz linear power devices. The advantage of the switch mode power supply technology first consists of the reduced construction size and the reduced weight of the apparatus in comparison to a linear device.

In a piezoelectric transformer, the energy is transferred by mechanical oscillation from the primary to the secondary side. Piezoelectric transformers are manufactured from suitable ceramics and have a primary-side and a secondary-side electrode area, as FIG. 1 schematically shows.

The output voltage and the output current of a switch mode power supply are usually regulated independently of the type of transformer, i.e., the output voltage is constant independently of the load to be supplied and up to a maximum current. When the maximum load is exceeded or in the case of a short circuit, the current is maintained constant and thus limited. Most of the regulated switch mode power supplies in the low-power range are regulated on the primary side for reasons of cost, i.e., the regulating apparatus is located on the primary side of the switch mode power supply.

Patent DE 102 59 088 describes such a switch mode power supply with piezoelectric transformer. The output voltage on a variable load is maintained constant here by varying the working frequency and the ratio of cutting-in and cutting-out periods. For this, information regarding the output current is transmitted from the secondary side to the primary side. This transmission must, in order to maintain the pertinent norms, take place in a galvanically separated manner and an optocoupler with appropriate peripheral wiring is usually used.

Patents EP 1146630 and EP 1211794 describe a switch mode power supply with magnetic transformer and regulated on the primary side, in which power supply the output voltage is maintained constant by pulse-width modulation. The information about the level of the output voltage is gained with the aid of an additional winding arranged on the converter transformer. An auxiliary voltage proportional to the output voltage can be tapped off on the auxiliary winding in these known regulating circuits. The auxiliary winding is associated with the primary side of the switch mode power supply and therefore no additional galvanically separated transmission by optocoupler or signal transmission from the secondary side is required. This reduces the number of structural components and results in significant cost savings. However, such known switch mode power supplies controlled on the primary side still contain an electromagnetic transformer with all its above-cited disadvantages.

The present invention is therefore based on the problem of indicating a piezoelectric transformer that can be used in a switch mode power supply controlled on the primary side with the active principles of patents EP 1146630 and EP 1211794. Furthermore, the present invention is based on the problem of indicating an associated control circuit for such a switch mode power supply.

SUMMARY

This problem is solved by the subject matter of the independent claims. Advantageous further developments of the present invention constitute subject matter of the dependent claims.

The present invention is based on the idea that an elevated circuit expense in comparison to electromagnetic transmitters with auxiliary winding can be avoided in that the transmission of information about the output quantity, i.e., about the output voltage, takes place via the piezoelectric transformer itself.

The regulation of the output voltage can take place in a switch mode power supply with piezoelectric transformer by varying the working frequency. When moving away from the resonance frequency of the piezoelectric transformer, the energy transmitted onto the secondary side is reduced. In order to close the regulating circuit, the regulating quantity, in this case the output voltage of the switch mode power supply, must be supplied in a galvanically separated manner to the regulating apparatus on the primary side of the switch mode power supply. This is achieved in accordance with the invention in that a further electrode arrangement, a so-called auxiliary electrode arrangement, is integrated into the piezoelectric transformer in addition to the primary and secondary electrode arrangements. The auxiliary electrode arrangement is located according to an advantageous further development of the present invention on the primary side of the piezoelectric transformer. Thus, the tapped-off voltage can be directly supplied to the regulator without galvanic separation.

A signal proportional to the output voltage can be tapped off on the additionally inserted electrode pair that can be used as regulating quantity for the regulating apparatus arranged on the primary side.

According to a further advantageous embodiment of the present invention, the voltage tapped of on the auxiliary electrode arrangement is supplied to a filter, especially to a filter constructed as a deep pass, so that only the base oscillation of the piezoelectric transformer can pass. Harmonic oscillations that are possibly excited can be filtered out in this manner to improve the proportionality between the output voltage and the regulating voltage tapped of on the auxiliary electrode arrangement.

The voltage tapped off on the additional auxiliary electrode arrangement is a function of the spacing of these electrodes and is additionally proportional to the mechanical stress within the piezoelectric transformer. The mechanical stress is not constant over the entire geometric length of the piezoelectric transformer, but rather is described by a sinusoidal function. A variation of the frequency with which the piezoelectric transformer is excited thus also entails a variation of the distribution of the mechanical stress over the length of the piezoelectric transformer. It is therefore advantageous to place the auxiliary electrodes at a position at which the mechanical stress fluctuates only by a small amount, thus, e.g., in a terminal edge area.

The voltage tapped off on the additional auxiliary electrode arrangement can be used according to an advantageous further development of the invention for the energy supply of the regulating apparatus arranged on the primary side. Here, the surface of the electrodes and therewith the capacity of this additional electrode arrangement can be appropriately adapted to the energy consumption of the regulating apparatus.

In order to better understand the present invention, it is explained in detail using the embodiment example shown in the following figures. In them, the same parts are provided with the same reference numerals and the same designations of structural components. Furthermore, several features or feature combinations from the different embodiments shown and described can also constitute intrinsically independent, inventive solutions or solutions in accordance with the invention.

DETAILED DESCRIPTION

The piezoelectric transformer 100 is shown in detail in the following, with reference made to FIG. 2. Piezoelectric transformer 100 comprises, as is known, a base body 108 consisting of a piezoelectric material. Primary-side electrodes 102 convert a primary-side voltage or input voltage (see also FIGS. 3 and 4) via the piezoelectric effect into a mechanical oscillation.

A transformed output voltage is produced on the secondary side as a consequence of the mechanical oscillation on secondary-side electrodes 104, and the output voltage can be a higher or a lower voltage than the input voltage. That is, the method of functioning of piezoelectric transformer 100 can be understood as a double conversion procedure, in which a first piezoelectric conversion converts electrical energy into mechanical energy, and a reverse conversion of the mechanical energy into electrical energy takes place. As U.S. Pat. No. 2,830,274 explains, mechanical energy is transferred here from a first area of piezoelectric body 108 that cooperates with the input electrodes to a second area of the piezoelectric body that cooperates with the output electrodes.

Figure 1:
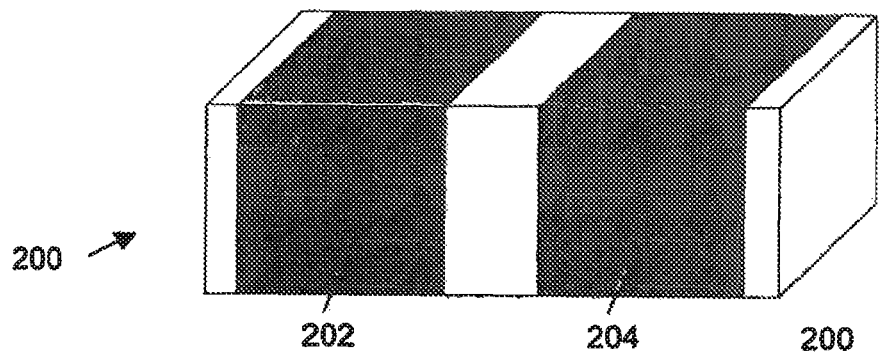
FIG. 1 shows a schematic view of a piezoelectric transformer with primary-side and secondary-side electrode areas.
Figure 2:
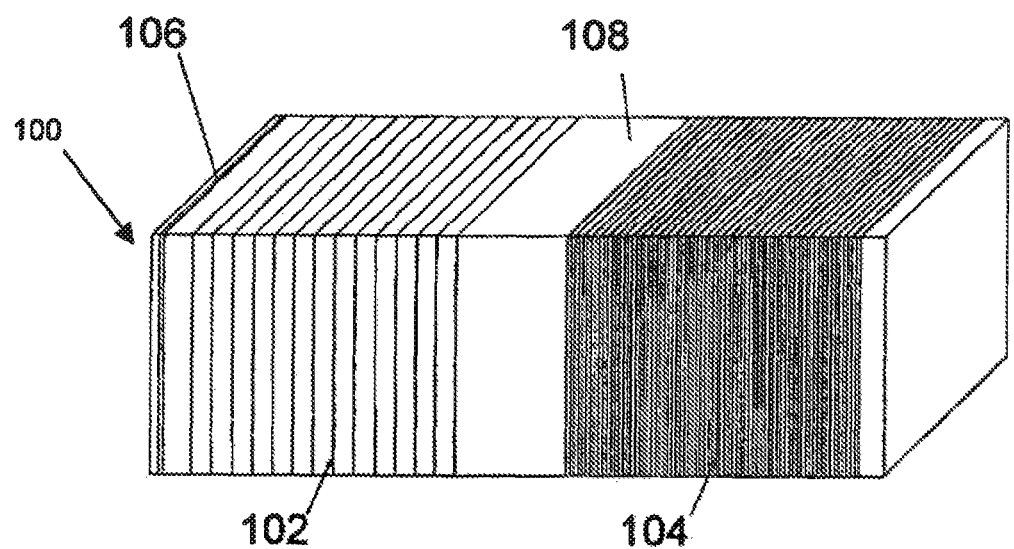
FIG. 2 shows a piezoelectric transformer with an additional electrode arrangement on the primary side.

According to the invention, the piezoelectric transformer shown in FIG. 2 has an additional electrode arrangement 106 that makes use of the fact that the mentioned electromechanical conversion process also takes place in the opposite direction. That is, a signal proportional to the output voltage can be tapped off on the additionally inserted electrode pair 106 and can be used for a regulating apparatus arranged on the primary side when used in a switch mode power supply as regulating quantity.

Figure 3:
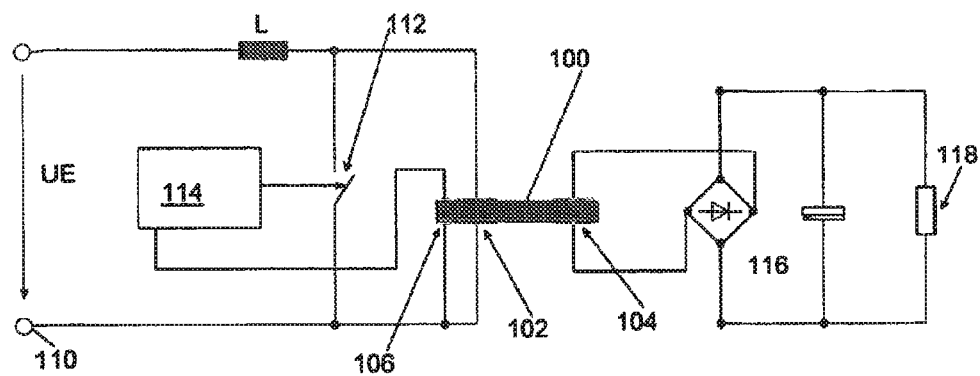
FIG. 3 shows a block diagram of the regulating circuit as well as the control circuit of a switch mode power supply with a piezoelectric transformer in accordance with the invention.

A block diagram of a regulating circuit for the piezoelectric transformer 100 in accordance with the invention as well as the associated control circuit is shown in FIG. 3. Here, an input voltage is put on the input terminals 110. Furthermore, the input voltage is connected to primary-side electrodes 102. A switch 112, for example, a transistor, is regulated by a regulator 114. According to the invention, the auxiliary voltage tapped off on additional electrode arrangement 106 is supplied to regulator 114 as regulating quantity. Regulator 114 evaluates this signal and controls switch 102 accordingly. The transformed output voltage can be tapped of on secondary-side electrodes 104, rectified in a rectifier 116 and output to a load 118.

In the special embodiment shown here, additional electrode arrangement 106 is located on the primary side of piezoelectric transformer 100. Thus, the tapped-off voltage can be supplied directly without galvanic separation to the regulator. The regulation of the output voltage takes place in such a switch mode power supply with piezoelectric transformer 100 by varying the working frequency. When moving away from the resonance frequency of piezoelectric transformer 100, the energy transmitted onto the secondary side is reduced.

Figure 4:
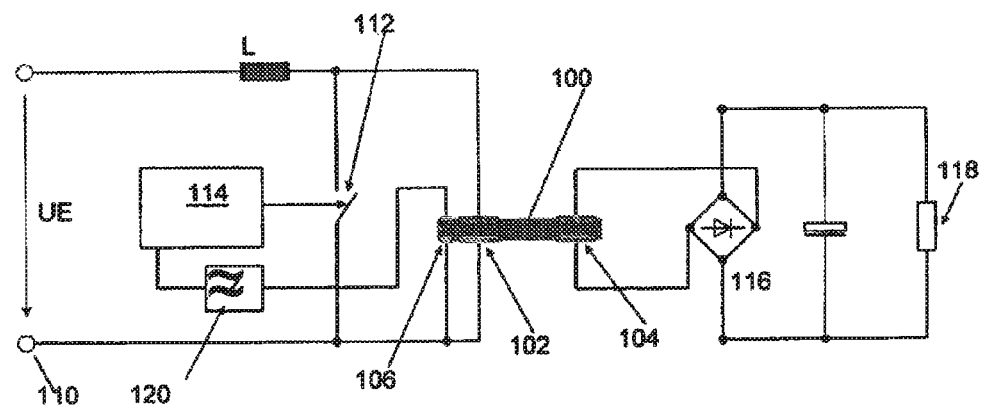
FIG. 4 shows another embodiment of a regulating circuit for a switch mode power supply with the piezoelectric transformer in accordance with the invention.

FIG. 4 shows another embodiment of the solution in accordance with the invention. Here, another filter is connected between the voltage tapped off on the additional electrode arrangement 106 and regulator 114. This filter 120 is designed as a deep pass so that only the base oscillation of piezoelectric transformer 100 passes fitter 120. The harmonic oscillations that can be excited are filtered out, which improves the proportionality between the output voltage and the auxiliary voltage tapped off on additional electrode arrangement 106.

The auxiliary voltage on additional electrode arrangement 106 is a function of the state of these two electrodes together. It is additionally proportional to the mechanical stress inside piezoelectric transformer 100. This mechanical stress is not constant over the entire geometric length of piezoelectric transformer 100, but rather is described by a sinusoidal function. A varying of the frequency with which piezoelectric transformer 100 is excited therefore causes a varying of the distribution of the mechanical stress over the entire length of piezoelectric transformer 100. It is therefore advantageous to place auxiliary electrodes 106 at a position at which the mechanical stress fluctuates only by a small amount. This position can be, for example, in the end region of the piezoelectric transformer.

According to a further advantageous embodiment, the voltage tapped off on additional electrode arrangement 106 can also be used for the energy supply of regulating apparatus 114 arranged on the primary side. To this end, the surface of electrodes 106 and therewith the capacity of this additional electrode arrangement can be accordingly adapted to the energy consumption of regulating apparatus 114.

The piezoelectric transformer in accordance with the invention with feedback electrode thus makes possible a simple transmission of information via the height of the output voltage from the secondary side to the primary side. An optocoupler including the expensive peripheral wiring can be eliminated in that the information is transmitted via the output voltage directly via the piezoelectric transformer. Thus, a switch mode power supply with a piezoelectric transformer including a primary regulation can be realized in an extremely small space and with a minimum of structural components.

The invention claimed is:

1. A switched mode power supply for supplying a regulated output voltage from an input voltage, comprising:
    a piezoelectric transformer including primary-side electrodes coupled to the input voltage, secondary-side electrodes coupled to a secondary-side voltage, and auxiliary electrodes for generating an auxiliary voltage proportional to the secondary-side voltage wherein the auxiliary electrodes are placed at a position on the piezoelectric transformer where the mechanical stress fluctuation is at a minimum of a sinusoidal fluctuation of mechanical stress in the piezoelectric transformer;
    a switching circuit coupled to the primary-side electrodes;
    a rectifier for rectifying the output voltage from the secondary-side voltage; and
    a regulator coupled to the switching circuit and the auxiliary voltage, the regulator controlling the switching circuit based on the auxiliary voltage.

2. The switched mode power supply of claim 1, wherein the auxiliary electrodes are placed at a terminal end area of the piezoelectric transformer.

3. The switched mode power supply of claim 2, wherein the terminal end area is on a primary side of the piezoelectric transformer.

4. The switched mode power supply of claim 1, wherein auxiliary electrodes are located on a side of the piezoelectric transformer.

5. The switched mode power supply of claim 1, wherein the regulator regulates the output voltage by controlling the switching circuit to vary a working frequency of the piezoelectric transformer.

6. The switched mode power supply of claim 5, wherein the working frequency is different from a resonance frequency of the piezoelectric transformer.

7. The switched mode power supply of claim 1, further including a choke coupled in between the input voltage and the primary-side electrodes.

8. The switched mode power supply of claim 1, wherein the switching circuit includes a transistor and the regulator is coupled to the controlling terminal of the transistor.

9. The switched mode power supply of claim 1, further including a deep-pass filter coupled to the auxiliary electrodes and the regulator that passes the base oscillation of the piezoelectric transformer to the regulator and filters out harmonic oscillations of the piezoelectric transformer.

10. The switched mode power supply of claim 1, wherein the regulated output voltage is lower than the input voltage.

11. The switched mode power supply of claim 1, wherein the regulated output voltage is higher than the input voltage.

12. The switched mode power supply of claim 1, wherein a voltage supply for the regulator is provided by the auxiliary electrodes.

* * * * *